US012770705B2

(12) United States Patent
Tiwari et al.

(10) Patent No.: US 12,770,705 B2
(45) Date of Patent: Oct. 20, 2026

(54) MEMORY MIRROR SEQUENCING FOR REDUCED LATENCY IN MEMORY PATCHING

(71) Applicant: QUALCOMM Incorporated, San Diego, CA (US)

(72) Inventors: Rajesh Kumar Tiwari, Bangalore (IN); Mohammed Zuber P Malek, Bengaluru (IN); Chintakrindi Bhavana, Mangalagiri (IN); Srinivasa Rao Dasari, Visakhapatnam (IN)

(73) Assignee: QUALCOMM Incorporated, San Diego, CA (US)

( * ) Notice: Subject to any disclaimer, the term of this patent is extended or adjusted under 35 U.S.C. 154(b) by 50 days.

(21) Appl. No.: 18/940,473

(22) Filed: Nov. 7, 2024

(65) Prior Publication Data

US 2026/0128112 A1 May 7, 2026

(51) Int. Cl.
*G11C 29/36* (2006.01)

(52) U.S. Cl.
CPC ...... *G11C 29/36* (2013.01); *G11C 2029/3602* (2013.01)

(58) Field of Classification Search
CPC ........................ G11C 29/36; G11C 2029/3602
See application file for complete search history.

(56) References Cited

U.S. PATENT DOCUMENTS

| | | | |
|---|---|---|---|
| 4,315,330 A | 2/1982 | Brickman et al. | |
| 6,401,199 B1 | 6/2002 | Klein | |
| 2016/0003903 A1* | 1/2016 | Weng | G01R 31/31935 714/733 |
| 2016/0077839 A1* | 3/2016 | Watanabe | G06F 8/65 713/2 |
| 2018/0039580 A1* | 2/2018 | Schneider | G06F 12/1009 |
| 2020/0135290 A1 | 4/2020 | Narayanan et al. | |
| 2020/0388346 A1* | 12/2020 | Narayanan | G11C 11/005 |

OTHER PUBLICATIONS

International Search Report and Written Opinion—PCT/US2025/047582—ISA/EPO—Feb. 2, 2026.

* cited by examiner

*Primary Examiner* — Thien Nguyen
(74) *Attorney, Agent, or Firm* — Loza & Loza LLP

(57) ABSTRACT

Aspects of the disclosure are directed to memory mirror sequencing for memory patching. In accordance with one aspect, the disclosure includes initializing a memory mirror sequence (MMS) controller for a plurality of parallel read only memory (ROM) to random access memory (RAM) copy operations for a random access memory (RAM) wherein the MMS controller includes one or more parallelization parameters; triggering a parallel ROM to RAM copy procedure using the MMS controller with the one or more parallelization parameters; and executing a memory patching process to update one or more selected contents of the RAM for an updated built-in self-test (BIST) test pattern.

20 Claims, 8 Drawing Sheets

200

| BIST PON Phases 201 | BIST TT Budget 202 | Mem Patch Copy Time 203 | Boot KPI Impact 204 |
|---|---|---|---|
| MD-P1-1 | 25ms | 9.26ms | 37% |
| 201 | 202 | 203 | 204 |

300

| | Event 301 | Write Latency (ns) 302 | Read Latency (ns) 303 |
|---|---|---|---|
| 310 | HBCU Latency (REQ+RSP) | 359.45 | 359.45 |
| 320 | NOC Req Latency (HBCU ->APSS) | 75.11 | 75.11 |
| 330 | Apss Rsp Latency | 183.33 | 185.84 |
| 340 | NOC Req Latency (APSS ->HBCU) | 100.88 | 98.49 |

FIG. 3

| BIST PON Phases<br>501 | BIST TT Budget<br>502 | Mem Patch Copy Time<br>503 | Boot KPI Impact<br>504 |
|---|---|---|---|
| MD-P1-1 | 25ms | 4.1us | 0.0164% |

501 502 503 504

900

| | 910 | 920 | 930 | 940 |
|---|---|---|---|---|
| | S/no | Clock Freq | Mem Patch Copy Time (w/ 20% overhead) | Reduction |
| 911 | 1 | 600 mhz | 4.1 us | 9.26ms/4.1 us = 2.3K X |
| 912 | 2 | 1 Ghz | 2.46 us | 9.26ms/1.2 us = 7.7K X |
| 913 | 3 | 2 Ghz | 1.36 us | 9.26ms/9.6 us = 15.4K X |

FIG. 9

MEMORY MIRROR SEQUENCING FOR REDUCED LATENCY IN MEMORY PATCHING

TECHNICAL FIELD

This disclosure relates generally to the field of automotive electronics circuits, and, in particular, to memory mirror sequencing for memory patching. in automotive electronics circuits.

BACKGROUND

Automotive electronics circuits may include logical built-in self-test (LBIST) circuitry for diagnostic testing. The LBIST circuitry may require a plurality of test pattern data to be loaded into random access memory (RAM) as a test stimulus. In some scenarios, the plurality of test pattern data may need to be copied from a read only memory (ROM) to the RAM to accommodate any post manufacturing design updates. The ROM to RAM copy process incurs significant latency so a memory mirror sequencer implementation to perform the ROM to RAM copy process may be used to reduce copy process latency.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides memory mirror sequencing for memory patching. Accordingly, the present disclosure discloses an information processing system including: a plurality of read only memories (ROMs) configured to store a built-in self-test (BIST) test pattern; a memory mirror sequence (MMS) controller coupled to the plurality of ROMs, the MMS controller configured to trigger a parallel read only memory (ROM) to random access memory (RAM) copy procedure to copy the BIST test pattern from the plurality of ROMs; a plurality of random access memories (RAMs) coupled to the MMS controller, the plurality of RAMs configured to receive the BIST test pattern; and a reprogramming programmable read only memory (PROM) coupled to the plurality of ROMs and the plurality of RAMs, the PROM configured to execute a memory patching process to update the BIST test pattern to generate an updated built-in self-test (BIST) test pattern.

In one example, the MMS controller uses one or more parallelization parameters to trigger the parallel ROM to RAM copy procedure. In one example, the one or more parallelization parameters include a quantity of the plurality of ROMS used in the parallel ROM to RAM copy procedure. In one example, the one or more parallelization parameters include an adjusted clock frequency used in the parallel ROM to RAM copy procedure to obtain a low latency result; and wherein the adjusted clock frequency is greater than a baseline clock frequency of the information processing system. In one example, the plurality of RAMs is further configured to store the updated BIST test pattern.

Another aspect of the disclosure provides an apparatus including: means for initializing a memory mirror sequence (MMS) controller for a plurality of parallel read only memory (ROM) to random access memory (RAM) copy operations for a random access memory (RAM) wherein the MMS controller includes one or more parallelization parameters; means for triggering a parallel ROM to RAM copy procedure using the MMS controller with the one or more parallelization parameters; and means for executing a memory patching process to update one or more selected contents of the RAM for an updated built-in self-test (BIST) test pattern.

In one example, the apparatus further includes: means for performing a plurality of built-in self-test (BIST) sequences using the updated BIST test pattern; means for validating a performance of the plurality of BIST sequences; and means for reporting a built-in self-test (BIST) status. In one example, the apparatus further includes: means for determining if a memory patch for a read only memory (ROM) in an information processing system is required; and means for triggering a system built-in self-test (BIST) operation on the information processing system.

Another aspect of the disclosure provides a method including: initializing a memory mirror sequence (MMS) controller for a plurality of parallel read only memory (ROM) to random access memory (RAM) copy operations for a random access memory (RAM) wherein the MMS controller includes one or more parallelization parameters; triggering a parallel ROM to RAM copy procedure using the MMS controller with the one or more parallelization parameters; and executing a memory patching process to update one or more selected contents of the RAM for an updated built-in self-test (BIST) test pattern.

In one example, the one or more parallelization parameters is used in the parallel ROM to RAM copy procedure over a plurality of read only memories (ROMs). In one example, the one or more parallelization parameters include a quantity of read only memories (ROMs) used simultaneously in the parallel ROM to RAM copy procedure. In one example, the one or more parallelization parameters include an adjusted clock frequency. In one example, the adjusted clock frequency is greater than a baseline clock frequency of an information processing system.

In one example, the method further includes using the adjusted clock frequency in the parallel ROM to RAM copy procedure to obtain a low latency result. In one example, the MMS controller manages the memory patching process by using the one or more parallelization parameters. In one example, the method further includes performing a plurality of built-in self-test (BIST) sequences using the updated BIST test pattern. In one example, the method further includes validating a performance of the plurality of BIST sequences; and reporting a built-in self-test (BIST) status. In one example, the method further includes determining if a memory patch for a read only memory (ROM) in an information processing system is required. In one example, the method further includes triggering a system built-in self-test (BIST) operation on the information processing system. In one example, the method further includes initiating a power ON operation for the information processing system; and initiating a primary boot load (PBL) operation for the information processing system.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

FIG. 3 illustrates an example event write and read latency table.

FIG. 9 illustrates an example memory copy performance table.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figures 1, 2:
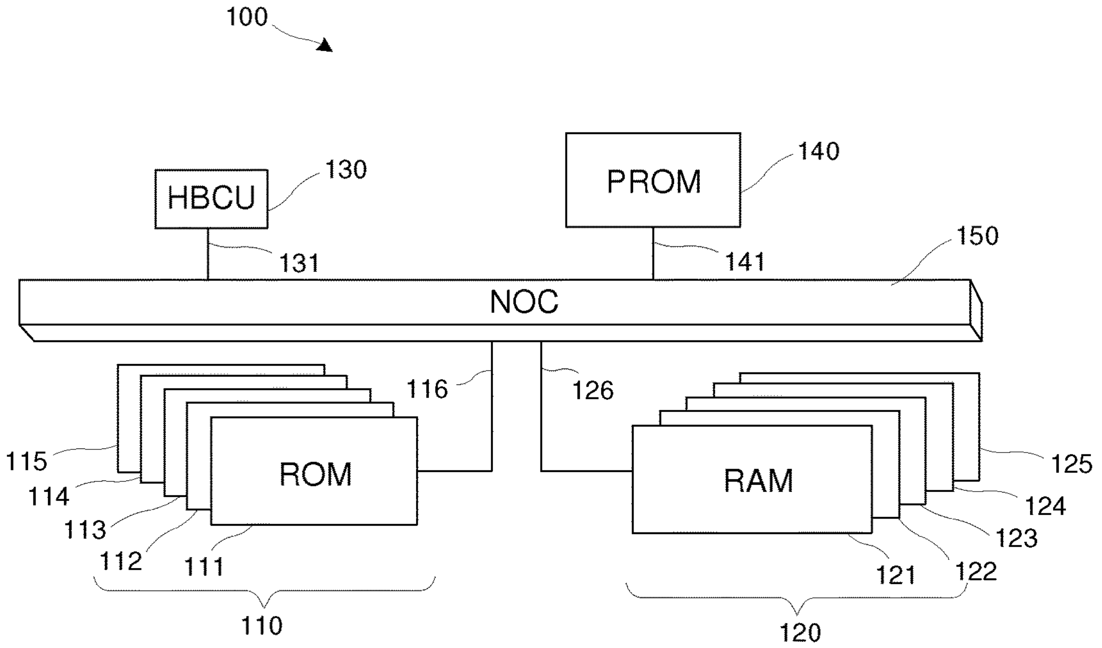
FIG. 1 illustrates a first example system built-in self-test (BIST) implementation.
FIG. 2 illustrates a first example system boot key performance indicator (KPI) table.

FIG. 1 illustrates a first example system built-in self-test (BIST) implementation 100. In one example, the first example system BIST implementation 100 includes a plurality of read only memories (ROMs) 110, a plurality of random access memories (RAMs) 120, a hardware BIST control unit (HBCU) 130, a reprogramming programmable ROM (PROM) 140 and a network on a chip (NOC) 150. In one example, the plurality of ROMs 110 includes a first ROM 111, a second ROM 112, a third ROM 113, a fourth ROM 114 and a fifth ROM 115. In one example, the plurality of ROMs 110 is connected to the NOC 150 with a ROM interconnection line 116.

In one example, the plurality of RAMs 120 includes a first RAM 121, a second RAM 122, a third RAM 123, a fourth RAM 124 and a fifth RAM 125. In one example, the plurality of RAMs 120 is connected to the NOC 150 with a RAM interconnection line 126.

In one example, the HBCU 130 is used for management and control of BIST memory operations, including copying contents of the plurality of ROMs 110 to the plurality of RAMs 120. In one example, the HBCU 130 is connected to the NOC 150 with a HBCU interconnection line 131. In one example, the reprogramming PROM 140 is used for providing any post-manufacturing ROM data updates (i.e., a ROM patch) prior to BIST operation.

In one example, a hardware-enabled BIST operation may require a BIST test pattern to be stored in on-chip memory (e.g., ROM, RAM, etc.). In one example, a BIST test pattern memory patching procedure may be used to accommodate a post-manufacturing ROM data update. For example, the BIST test pattern memory patching procedure may execute a patching algorithm to update selected RAM contents after an initial ROM to RAM copy procedure.

In one example, the initial ROM to RAM copy procedure may be initiated by fuse sensing. In one example, the HBCU 130 initiates a copy through the NOC 150. For example, if there are five ROMs each with a memory capacity of 8 kbytes, there is a total ROM memory capacity of 40 kbytes=40960 bits (assuming 1 kbyte=8192 bits). In one example, if each word is 32 bits, a total number of copy word transactions is 40960 bits/32 bits per word=10240 copy word transactions. In one example if each copy word transaction requires 905 nanoseconds (e.g., 1/1.105 MHz), the total copy transaction time is 905 ns*10240=9.3 ms. Thus, the initial ROM to RAM copy procedure may incur latency.

FIG. 2 illustrates a first example system boot key performance indicator (KPI) table 200. In one example, the first system boot KPI table 200 includes a BIST power on (PON) phase 201, a BIST test time (TT) budget 202, a memory patch copy time 203 and a boot KPI impact 204. For example, for a MD-P1-1 phase, the BIST TT budget 202 is 25 ms and the memory patch copy time 203 is 9.26 ms, resulting in a boot KPI impact 204 of 37% which is a relatively high test time overhead.

FIG. 3 illustrates an example event write and read latency table 300. In one example, the event write and read latency table 300 includes an event column 301, a write latency collum 302 and a read latency column 303. For example, for an HBCU latency event 310, the HBCU write latency is 359.45 ns and the HBCU read latency is 359.45 ns. For example, for an NOC request latency event 320, the NOC write latency is 75.11 ns and the NOC read latency is 75.11 ns. For example, for an APSS response latency event 330, the APSS write latency is 183.33 ns and the APSS read latency is 185.84 ns. For example, for an NOC response latency event 340, the NOC response write latency is 100.88 ns and the NOC response read latency is 98.49 ns.

Figures 4, 5:
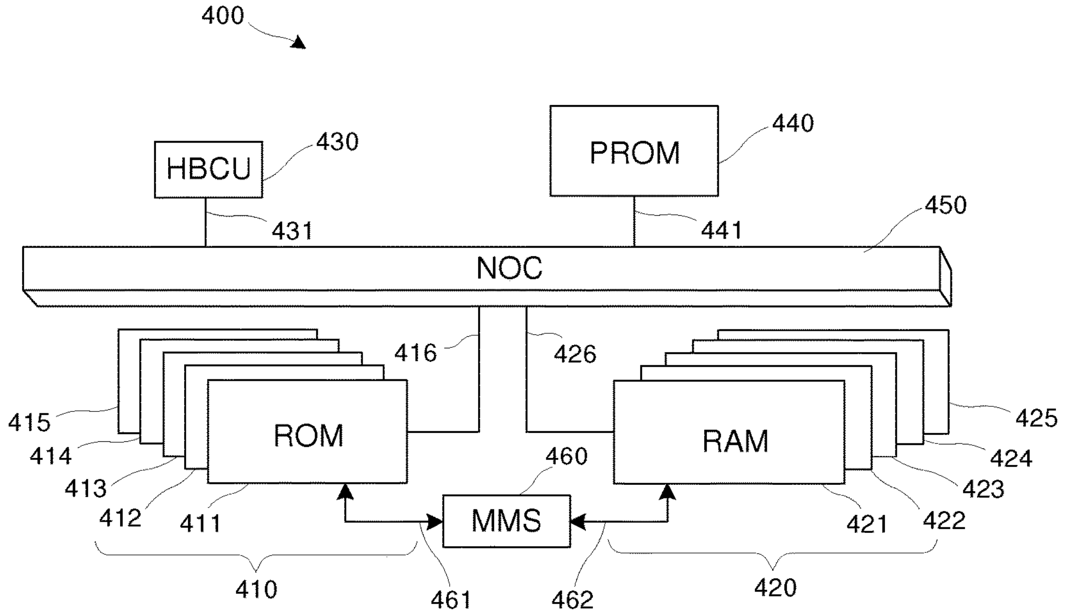
FIG. 4 illustrates a second example system built-in self-test (BIST) implementation.
FIG. 5 illustrates a second example system boot key performance indicator (KPI) table.

FIG. 4 illustrates a second example system built-in self-test (BIST) implementation 400. In one example, the second example system BIST implementation 400 includes a plurality of read only memories (ROMs) 410, a plurality of random access memories (RAMs) 420, a hardware BIST control unit (HBCU) 430, a reprogramming programmable ROM (PROM) 440, a network on a chip (NOC) 450 and a memory mirror sequencer 460. In one example, the plurality of ROMs 410 includes a first ROM 411, a second ROM 412, a third ROM 413, a fourth ROM 414 and a fifth ROM 415. In one example, the plurality of ROMs 410 is connected to the NOC 450 with a ROM interconnection line 416.

In one example, the plurality of RAMs 420 includes a first RAM 421, a second RAM 422, a third RAM 423, a fourth RAM 424 and a fifth RAM 425. In one example, the plurality of RAMs 420 is connected to the NOC 450 with a RAM interconnection line 426.

In one example, the HBCU 430 is used for management and control of BIST memory operations, including copying contents of the plurality of ROMs 410 to the plurality of RAMs 420. In one example, the HBCU 430 is connected to the NOC 450 with a HBCU interconnection line 431. In one example, the PROM 440 is connected to the NOC 450 with a PROM interconnection line 441. In one example, the reprogramming PROM 440 is used for providing any post-manufacturing ROM data updates (i.e., a ROM patch) prior to BIST operation.

In one example, the memory mirror sequencer 460 is implemented as custom digital logic using, for example, firmware to execute a revised ROM to RAM copy procedure with much lower latency that the initial ROM to RAM copy procedure. In one example, the memory mirror sequencer includes a parameterizable digital logic with a trigger-based interface. In one example, the trigger-based interface accepts a trigger event (e.g., a fuse event) from the HBCU 430.

In one example, memory mirror sequence 460 operates in a parallel manner with a simultaneous memory copying process. For example, if there are five ROMs each with a memory capacity of 8 kbytes, there is a total ROM memory capacity of 40 kbytes=40960 bits (assuming 1 kbyte=8192 bits). In one example, if each word is 32 bits, a total number of copy word transactions is 40960 bits/32 bits per word=10240 copy word transactions. In one example, if the five ROMs are accessed in parallel, then there are 10240/5=2048 parallel copy transactions. In one example if each parallel copy word transaction requires 1.67 nanoseconds (e.g., 1/600 MHz), the total copy transaction time is 1.67 ns*2048=3.42 microseconds. For example, assuming a 20% overhead test time, the effective total copy transaction time is 4.1 microsecond (i.e., a reduction of 9.26 ms/4.1 μs=2258).

FIG. 5 illustrates a second example system boot key performance indicator (KPI) table 500. In one example, the second system boot KPI table 500 includes a BIST power on (PON) phase 501, a BIST test time (TT) budget 502, a memory patch copy time 503 and a boot KPI impact 504. For example, for a MD-P1-1 phase, the BIST TT budget 502 is 25 ms and the memory patch copy time 503 is 4.1 μs, resulting in a boot KPI impact 504 of 0.0164% which is a negligible test time overhead.

Figure 6:
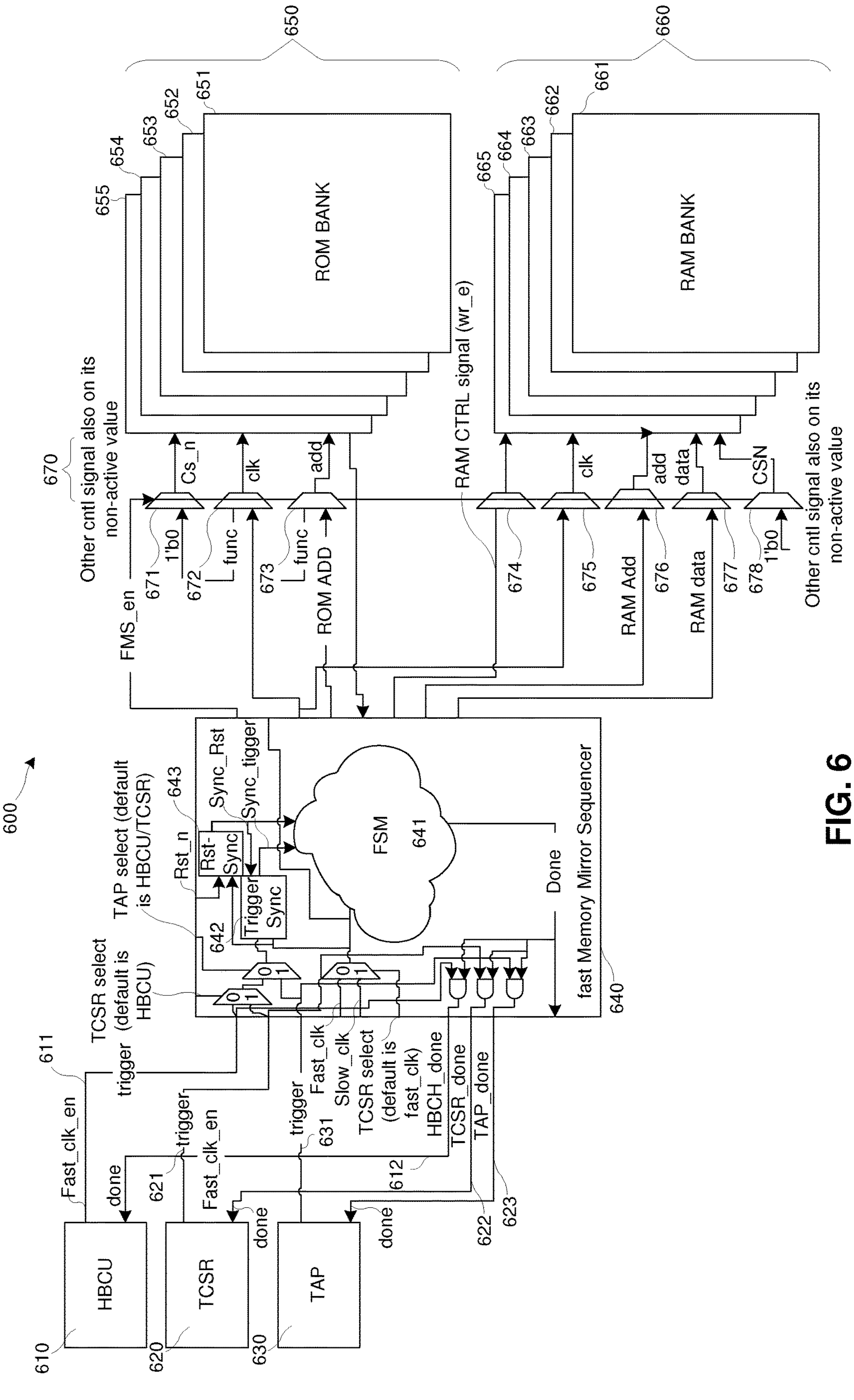
FIG. 6 illustrates an example memory mirror (MMS) sequencer architecture.

FIG. 6 illustrates an example memory mirror sequencer (MMS) architecture 600. In one example, the MMS architecture 600 includes a hardware BIST control unit (HBCU) 610, a test configuration software register (TCSR) 620, a test access port (TAP) 630, a memory mirror sequencer (MMS) 640, a plurality of ROMs 650, a plurality of RAMs 660 and a plurality of multiplexers 670. In one example, the HBCU 610 is used for management and control of BIST memory operations, including copying contents of the plurality of ROMs 650 to the plurality of RAMs 660. In one example, the TCSR 620 is used to store test configuration parameters (e.g., parallelization parameters). In one example, the TAP 630 provides test access to the MMS 640.

In one example, the HBCU 610 sends a HBCU trigger signal 611 to the MMS 640, the TCSR 620 sends a TCSR trigger signal 612 to the MMS 640 and the TAP 630 sends a TAP trigger signal 631 to the MMS 640. In one example, the HBCU 610 receives a HBCU done signal 612 from the MMS 640, the TCSR 620 receives a TCSR done signal 622 from the MMS 640 and the TAP 630 receives a TAP done signal 632 from the MMS 640.

In one example, the MMS 640 operates in a parallel manner with a simultaneous memory copying process. For example, the simultaneous memory copying process transfers data from the plurality of ROMs 650 to the plurality of RAMs 660. In one example, the MMS 640 includes a finite state machine (FSM) 641 for sequence controlling, a trigger synchronizer 642 to synchronize a sync trigger signal for the FSM 641 and a reset synchronizer 643 to synchronize a reset signal for the FSM 641. In one example, the MMS 640 sends a plurality of control signals to the plurality of ROMs 650 and the plurality of RAMs 660 to transfer memory contents from the plurality of ROMs 650 to the plurality of RAMs 660. In one example, the memory contents are transferred using a plurality of parallel ROM to RAM copy operations through the FSM 641.

In one example, the plurality of ROMs 650 includes a first ROM 651, a second ROM 652, a third ROM 653, a fourth ROM 654 and a fifth ROM 655. In one example, the plurality of RAMs 660 includes a first RAM 661, a second RAM 662, a third RAM 663, a fourth RAM 664 and a fifth RAM 665.

In one example, a plurality of multiplexers 670 are used to select a plurality of ROM interfaces for the plurality of ROMs 650 and a plurality of RAM interfaces for the plurality of RAMs 660. In one example, the plurality of multiplexers 670 includes a first multiplexer 671 to select an enable signal for the plurality of ROMs 650, a second multiplexer 672 to select a ROM clock for the plurality of ROMs 650 and a third multiplexer 673 to select a ROM add signal for the plurality of ROMs 650. In one example, the plurality of multiplexers 670 includes a fourth multiplexer 674 to select a RAM control signal for the plurality of RAMs 660, a fifth multiplexer 675 to select a RAM clock signal for the plurality of RAMs 660, a sixth multiplexer 676 to select a RAM signal for the plurality of RAMs 660, a seventh multiplexer 677 to select a RAM data signal for the plurality of RAMs 660 and an eighth multiplexer 678 to select a CSN signal for the plurality of RAMs 660.

Figure 7:
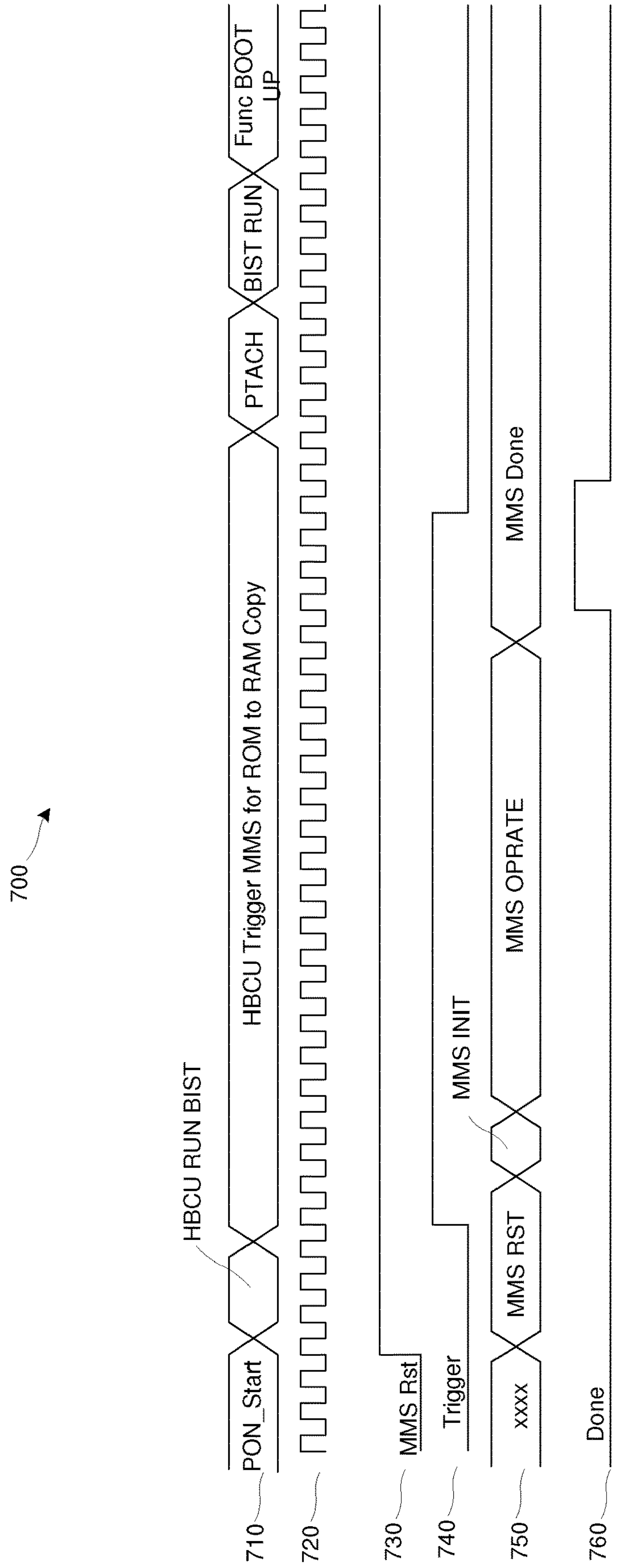
FIG. 7 illustrates an example built-in self-test (BIST) timeline.

FIG. 7 illustrates an example built-in self-test (BIST) timeline 700. In one example, the example BIST timeline 700 includes a status signal trace 710, a clock signal trace 720, a memory mirror sequence (MMS) reset signal trace 730, a trigger signal trace 740, a MMS status signal trace 750 and a completion status signal trace 760. In one example, the status signal trace 710 transitions through several states, such as a power on start state (e.g. PON-_Start), an HBCU run BIST state (e.g., HBCU RUN BIST), a ROM to RAM copy trigger state (e.g., HBCU Trigger QFMMS for ROM to RAM Copy), a PTACH state, a BIST run state (e.g., BIST RUN) and a functional boot state (e.g. Func BOOT UP).

In one example, the clock signal trace 720 shows a periodic clock waveform with a specified clock frequency. In one example, the MMS reset signal trace 730 shows a transition from an inactive state with a LOW level to a reset state with a HIGH level. In one example, the MMS reset signal trace 730 is used to initiate a BIST state after a startup state.

In one example, the trigger signal trace 740 transitions from a LOW level to a HIGH level and then back to the LOW level. In one example, the MMS status signal trace 750 transitions from a don't care state to a MMS reset state to a MMS initialization state to a MMS operate state to a MMS done state. In one example, the completion status signal trace 760 transitions from a LOW state to a HIGH state and then back to the LOW state.

Figure 8:
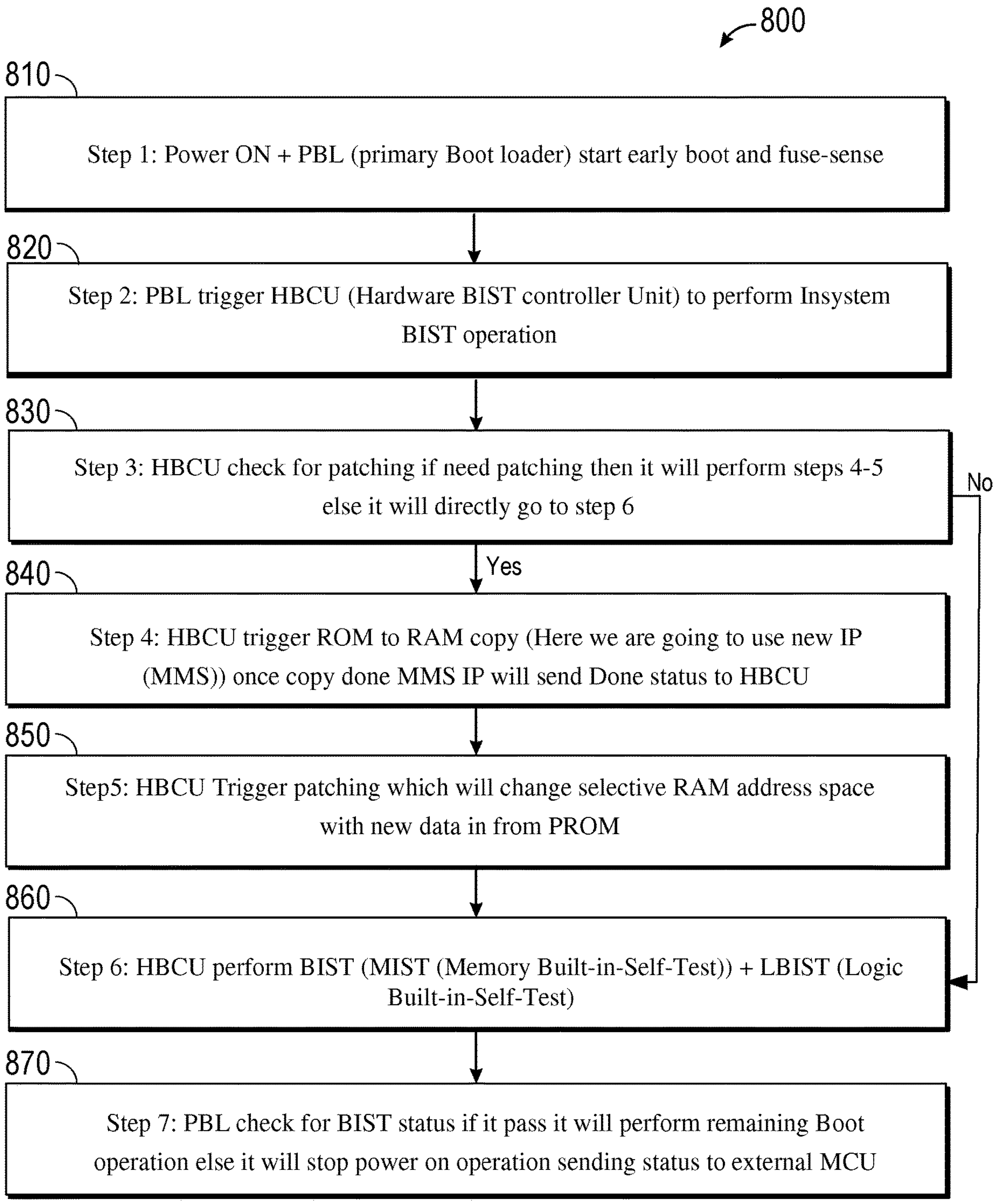
FIG. 8 illustrates an example built-in self-test (BIST) sequence diagram.

FIG. 8 illustrates an example built-in self-test (BIST) sequence diagram 800. In one example, a first step 810 executes a power on (PON) and primary boot loader (PBL) start for an early boot and fuse sense. In one example, a second step 820 executes a PBL trigger for a hardware BIST controller unit (HBCU) to initiate a system BIST operation. In one example, a third step 830 executes a HBCU check for a memory patch need. If a memory patch is needed, proceed to a fourth step and a fifth step to perform a memory patch; otherwise proceed to a sixth step. In one example, the fourth step 840 executes a ROM to RAM copy using a memory mirror sequence (MMS) and sends a done message to the HBCU when complete. In one example, the fifth step 850 executes a trigger patch which modifies selective RAM address space with new data from a reprogramming PROM. In one example, the sixth step executes a memory BIST (MBIST) and a logic BIST (LBIST) by the HBCU. In one example, a seventh step executes a PBL check for BIST status where if the BIST status is PASS, the PBL performs remaining boot operations and if the BIST status is FAIL, the PBL performs a power shutdown and informs an external controller of the BIST status.

FIG. 9 illustrates an example memory copy performance table 900. In one example, the memory copy performance table 900 includes a scenario number 910, a clock frequency 920, a memory patch copy time 930 and a time reduction 940. In one example, for a first scenario 911, the clock frequency is 600 MHz, the memory patch copy time is 4.1 microseconds (with 20% overhead) and the time reduction is 2300. In one example, for a second scenario 912, the clock frequency is 1000 MHz, the memory patch copy time is 2.46 microseconds (with 20% overhead) and the time reduction is 7700. In one example, for a third scenario 913, the clock frequency is 2000 MHz, the memory patch copy time is 1.36 microseconds (with 20% overhead) and the time reduction is 15400.

Figure 10:
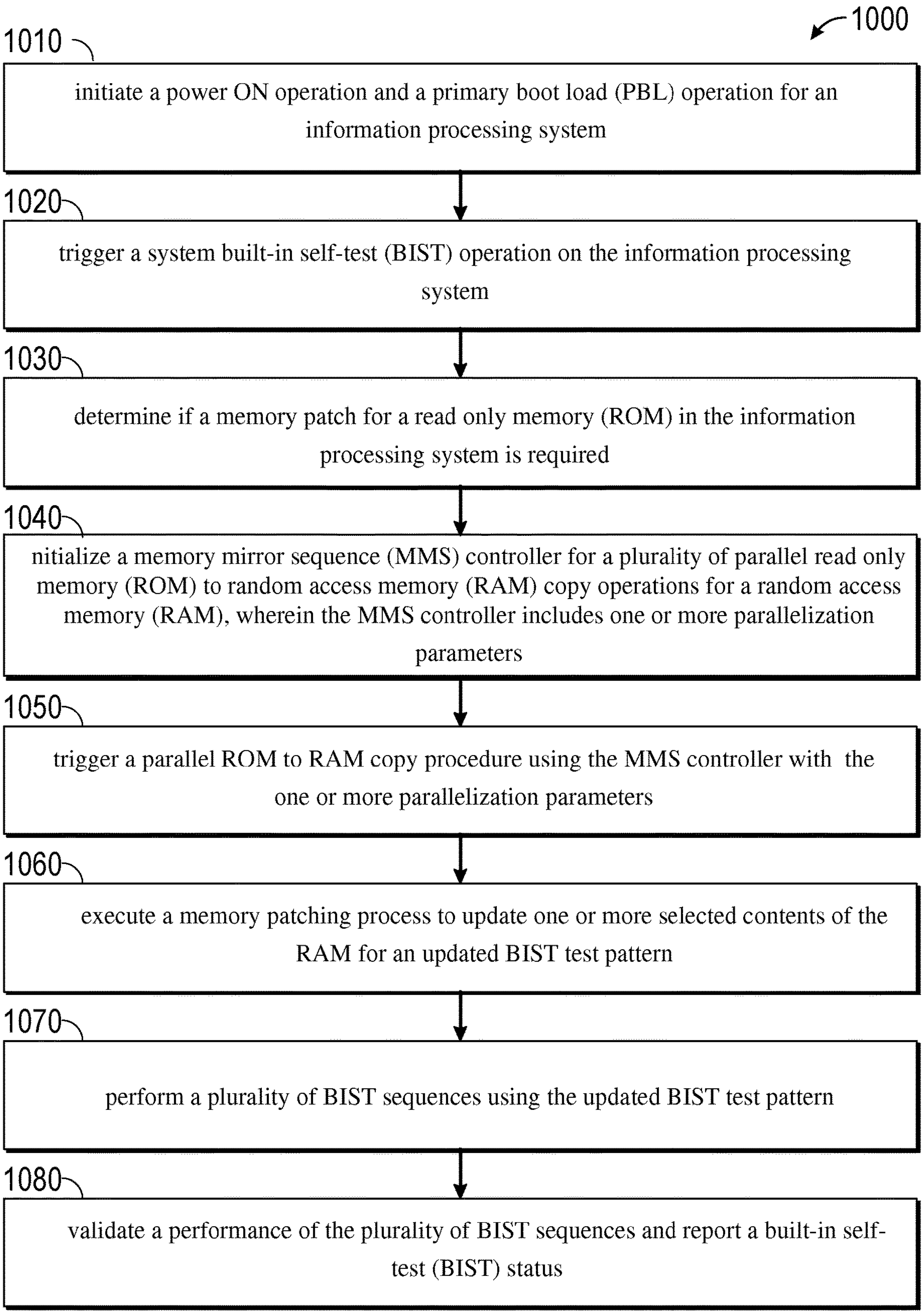
FIG. 10 illustrates an example flow diagram for implementing memory mirror sequencing for memory patching.

FIG. 10 illustrates an example flow diagram 1000 for implementing memory mirror sequencing for memory patching. In block 1010, initiate a power ON operation and a primary boot load (PBL) operation for an information processing system. In one example, a power ON operation is initiated and a primary boot load (PBL) operation for an information processing system is initiated. In one example, the power on and PBL operations initiate an early boot up procedure and fuse sense capability. In one example, the information processing system operates on a baseline clock frequency. In one example, the step of block 1010 is performed by a processing engine, an external controller, etc.

In block 1020, trigger a system built-in self-test (BIST) operation on the information processing system. In one example, a system built-in self-test (BIST) operation is triggered on the information processing system. In one example, the system BIST operation is managed by a hardware BIST controller unit (HBCU). In one example, the system BIST operations are triggered by the PBL. In one example, the step of block 1020 is performed by a processing engine, a hardware BIST control unit (HBCU), etc.

In block 1030, determine if a memory patch for a read only memory (ROM) in the information processing system is required. In one example, a memory patch for a read only memory (ROM) in the information processing system is determined if it is required or not. If the memory patch is required, then proceed to block 1040; else, proceed to block 1060. In one example, the ROM is a storage mechanism for the information processing system. In one example, the step of block 1030 is performed by a processing engine, a hardware BIST control unit (HBCU), etc.

In block 1040, initialize a memory mirror sequence (MMS) controller for a plurality of parallel read only memory (ROM) to random access memory (RAM) copy operations for a random access memory (RAM), wherein the MMS controller includes one or more parallelization parameters. In one example, a memory mirror sequence (MMS) controller is initialized for a plurality of parallel read only memory (ROM) to random access memory (RAM) copy operations for a random access memory (RAM), wherein the MMS controller includes one or more parallelization parameters.

In one example, the one or more parallelization parameters are used in a parallel ROM to RAM copy procedure over a plurality of ROMs. In one example, the one or more parallelization parameters include a quantity of ROMs used simultaneously in the parallel ROM to RAM copy procedure. In one example, the one or more parallelization parameters include an adjusted clock frequency. In one example, the adjusted clock frequency is greater than the baseline clock frequency of the information processing system. In one example, the MMS controller is implemented as custom digital logic with firmware. In one example, the step of block 1040 is performed by a processing engine, a memory mirror sequence (MMS) controller, etc.

In block 1050, trigger a parallel ROM to RAM copy procedure using the MMS controller with the one or more parallelization parameters. In one example, a parallel ROM to RAM copy procedure is triggered using the MMS controller with the one or more parallelization parameters. In one example, the MMS controller manages a memory patching process using the one or more parallelization parameters. In one example, the parallel ROM to RAM copy procedure executes firmware to execute a ROM to RAM copy procedure with low latency. In one example, the low latency results from using the parallel ROM to RAM copy procedure using simultaneously the quantity of ROMs specified in the one or more parallelization parameters. In one example, the step of block 1045 is performed by a processing engine, a memory mirror sequence (MMS) controller, etc.

In one example, the low latency results from using the adjusted clock frequency, for example, in the parallel ROM to RAM copy procedure. In one example, the MMS controller includes a parameterizable digital logic with a trigger-based interface. In one example, the trigger-based interface accepts a trigger event from the HBCU. In one example, the trigger event is a fuse event.

In block 1060, execute a memory patching process to update one or more selected contents of the RAM for an updated BIST test pattern. In one example, a memory patching process is executed to update one or more selected contents of the RAM for an updated BIST test pattern. In one example, the RAM retains the updated BIST test pattern. In one example, the updated selected RAM contents are obtained from a reprogramming PROM. In one example, the reprogramming PROM accommodates a post-manufacturing ROM data update. In one example, the step of block 1060 is performed by a processing engine, a reprogramming programmable read only memory (PROM), a PROM in conjunction with a network on a chip (NOC), etc.

In block 1070, perform a plurality of BIST sequences using the updated BIST test pattern. In one example, a plurality of BIST sequences is performed using the updated BIST test pattern. In one example, the updated BIST test pattern is a memory BIST test pattern. In one example, the updated BIST test pattern is a logic BIST test pattern. In one example, the step of block 1070 is performed by a processing engine, a hardware BIST control unit (HBCU), etc.

In block 1080, validate a performance of the plurality of BIST sequences and report a built-in self-test (BIST) status. In one example, a performance of the plurality of BIST sequences is validated and a built-in self-test (BIST) status is reported. In one example, if the performance of the plurality of BIST sequence indicates a BIST status of PASS, then continue remaining PBL operations for the information processing system and report the PASS BIST status to an external controller. In one example, if the performance of the plurality of BIST sequences indicates a BIST status of FAIL, then initiate a power off operation and report the FAIL BIST status to the external controller. In one example, the step of block 1080 is performed by a processing engine, a hardware BIST control unit (HBCU), etc.

In one aspect, one or more of the steps for providing memory mirror sequencing for memory patching in FIG. 10 may be executed by one or more processors which may include hardware, software, firmware, etc. The one or more processors, for example, may be used to execute software or firmware needed to perform the steps in the flow diagram of FIG. 10. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S. C. § 112, sixth paragraph, unless the element is expressly recited using the phrase "means for" or, in the case of a method claim, the element is recited using the phrase "step for."

One skilled in the art would understand that various features of different embodiments may be combined or modified and still be within the spirit and scope of the present disclosure.

What is claimed is:

1. An information processing system comprising:

a plurality of read only memories (ROMs) configured to store a built-in self-test (BIST) test pattern;

a memory mirror sequence (MMS) controller coupled to the plurality of ROMs, the MMS controller configured to trigger a parallel and simultaneous read only memory (ROM) to random access memory (RAM) copy procedure to copy the BIST test pattern from the plurality of ROMs using a plurality of parallel and simultaneous ROM to RAM copy operations through a finite state machine (FSM);

a plurality of random access memories (RAMs) coupled to the MMS controller, the plurality of RAMs configured to receive the BIST test pattern; and a reprogramming programmable read only memory (PROM) coupled to the plurality of ROMs and the plurality of RAMs, the PROM configured to execute a memory patching process to update the BIST test pattern to generate an updated built-in self-test (BIST) test pattern.

2. The information processing system of claim 1, wherein the MMS controller uses one or more parallelization parameters to trigger the parallel ROM to RAM copy procedure.

3. The information processing system of claim 2, wherein the one or more parallelization parameters include a quantity of the plurality of ROMS used in the parallel ROM to RAM copy procedure.

4. The information processing system of claim 3, wherein the one or more parallelization parameters include an adjusted clock frequency used in the parallel ROM to RAM copy procedure to obtain a low latency result; and wherein the adjusted clock frequency is greater than a baseline clock frequency of the information processing system.

5. The information processing system of claim 4, wherein the plurality of RAMs is further configured to store the updated BIST test pattern.

6. An apparatus comprising:

means for initializing a memory mirror sequence (MMS) controller for a plurality of parallel read only memory (ROM) to random access memory (RAM) copy operations for a random access memory (RAM) wherein the MMS controller includes one or more parallelization parameters;

means for triggering a parallel and simultaneous ROM to RAM copy procedure using the MMS controller with the one or more parallelization parameters and a plurality of parallel and simultaneous ROM to RAM copy operations through a finite state machine (FSM); and means for executing a memory patching process to update one or more selected contents of the RAM for an updated built-in self-test (BIST) test pattern.

7. The apparatus of claim 6, further comprising:

means for performing a plurality of built-in self-test (BIST) sequences using the updated BIST test pattern;

means for validating a performance of the plurality of BIST sequences; and means for reporting a built-in self-test (BIST) status.

8. The apparatus of claim 7, further comprising:

means for determining if a memory patch for a read only memory (ROM) in an information processing system is required; and means for triggering a system built-in self-test (BIST) operation on the information processing system.

9. A method comprising:

initializing a memory mirror sequence (MMS) controller for a plurality of parallel read only memory (ROM) to random access memory (RAM) copy operations for a random access memory (RAM) wherein the MMS controller includes one or more parallelization parameters;

triggering a parallel and simultaneous ROM to RAM copy procedure using the MMS controller with the one or more parallelization parameters and a plurality of parallel and simultaneous ROM to RAM copy operations through a finite state machine (FSM); and executing a memory patching process to update one or more selected contents of the RAM for an updated built-in self-test (BIST) test pattern.

10. The method of claim 9, wherein the one or more parallelization parameters are used in the parallel ROM to RAM copy procedure over a plurality of read only memories (ROMs).

11. The method of claim 9, wherein the one or more parallelization parameters include a quantity of read only memories (ROMs) used simultaneously in the parallel ROM to RAM copy procedure.

12. The method of claim 9, wherein the one or more parallelization parameters include an adjusted clock frequency.

13. The method of claim 12, wherein the adjusted clock frequency is greater than a baseline clock frequency of an information processing system.

14. The method of claim 13, further comprising using the adjusted clock frequency in the parallel ROM to RAM copy procedure to obtain a low latency result.

15. The method of claim 9, wherein the MMS controller manages the memory patching process by using the one or more parallelization parameters.

16. The method of claim 9, further comprising performing a plurality of built-in self-test (BIST) sequences using the updated BIST test pattern.

17. The method of claim 16, further comprising:

validating a performance of the plurality of BIST sequences; and reporting a built-in self-test (BIST) status.

18. The method of claim 17, further comprising determining if a memory patch for a read only memory (ROM) in an information processing system is required.

19. The method of claim 18, further comprising triggering a system built-in self-test (BIST) operation on the information processing system.

20. The method of claim 19, further comprising:

initiating a power ON operation for the information processing system; and initiating a primary boot load (PBL) operation for the information processing system.

* * * * *